United States Patent
Tong et al.

(10) Patent No.: US 6,756,256 B2
(45) Date of Patent: Jun. 29, 2004

(54) METHOD FOR PREVENTING BURNT FUSE PAD FROM FURTHER ELECTRICAL CONNECTION

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW); Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,803

(22) Filed: Feb. 20, 2003

(65) Prior Publication Data

US 2003/0162331 A1 Aug. 28, 2003

(30) Foreign Application Priority Data

Feb. 27, 2002 (TW) ........................ 91103526 A

(51) Int. Cl.[7] .............................................. H01L 21/82
(52) U.S. Cl. ...................... 438/132; 438/601; 257/529
(58) Field of Search .................................. 438/132, 601, 438/131, 600, 106, 4; 257/529, 530

(56) References Cited

U.S. PATENT DOCUMENTS

| | | | | |
|---|---|---|---|---|
| 6,566,730 B1 | * | 5/2003 | Giust et al. | 257/529 |
| 6,664,142 B2 | * | 12/2003 | Liu | 438/132 |
| 6,667,195 B2 | * | 12/2003 | Liu | 438/132 |
| 2003/0027379 A1 | * | 2/2003 | Liu | 438/132 |

OTHER PUBLICATIONS

Wolf et al. Silicon Processing for the VLSI Era, vol. 1—Process Technology, pp. 428, 529–534, 539–542, and 555, Lattice Press, 1986.*

* cited by examiner

Primary Examiner—John F. Niebling
Assistant Examiner—Jennifer M. Kennedy
(74) Attorney, Agent, or Firm—Jiang Chyun IP Office

(57) ABSTRACT

A method for preventing burnt fuse pads from further electrical connection suitable before the formation of bumps on the wafer. A dielectric layer is formed over the active surface of the wafer covering the bump pads and the fuse pads of the wafer, wherein a central region of the fuse pads is burnt to form a gap which allows the material of the dielectric layer to fill up the gap. Afterwards, either a part of the dielectric layer is removed and the part of the dielectric layer covering the fuse pads remainsor a part of the dielectric layer covering the bump pads is removed. Then, an under ball metallurgy layer is formed on the bump pads of the wafer so that the material of the under ball metallurgy layer does not cover the two sides of the fuse pad at the same time, or fill into the gap. As a result, the electrical isolation still remains.

8 Claims, 4 Drawing Sheets

METHOD FOR PREVENTING BURNT FUSE PAD FROM FURTHER ELECTRICAL CONNECTION

CROSS REFERENCE TO RELATED APPLICATIONS

This application claims the priority benefit of Taiwan application serial no. 91103526, filed on Feb. 27, 2002.

BACKGROUND OF INVENTION

1. Field of the Invention

The present invention is generally related to a method for preventing a burnt fuse pad from further electrical connection, and more particularly to a fabrication method of a bump on a wafer to prevent a burnt fuse pad from further electrical connection.

2. Description of Related Art

Semiconductor devices are usually provided with a fuse system which provides alternative electrical routing depending on whether the fuse wire is burnt or not. Using semiconductor devices as an example, in the fabrication of semiconductor components such as DRAM or SDRAM, due to the high integration of memory cells defects cells are commonly found. As the integration level is continuously increasing, the production yield of these semiconductor devices is lowered. Therefore in order to increase the yield of the fabrication of semiconductor devices, prior art utilizes redundancy circuit technology to improve the yield of the fabrication of semiconductor devices.

In the fabrication process of semiconductor components, besides the main memory cell array that is originally used for storing two bit data, a redundancy memory cell array is additionally fabricated in the peripheral region of the main memory cell array for replacing the defect memory cells during the fabrication process. The main memory cell array and the redundancy memory array are connected via the fuse pads. Therefore when a defect memory cell is being recovered, laser will burn the central region of the fuse pad to allow the redundancy memory cell array to replace the main memory cell array. Oppositely if no defect memory cell recovery is required, no laser burning is applied to the central region of the fuse pad.

After the memory chip is tested and recovered, the chip must undergo a packaging process. Prior art provides a kind of memory chip packaging such as small out-line package (SOP) which first adheres a memory chip onto a leadframe and then by means of wire bonding electrically connects the bonding pads of the chip and one end of the inner leads by conductive wires. Afterwards, a molding compound is deposited to encapsulate the chip, the conductive wires, and a part of the leadframe. The memory chip uses the outer lead which are located outside the leadframe as the signal input and output terminal. It is to be noted that when the memory chip is being recovered, a gap that is created by the laser burning the central region of the fuse pads is entirely filled up by the molding material during the packaging process.

In order for these chips with fuse pads to work with flip chip (F/C) packaging method, bumps must be formed on the bump pads of the chip and they must be connected to a substrate via a carrier. It is to be noted that before forming bumps on the bumps pads of the chip, an under ball metallurgy (UBM) layer is usually first formed on the bump pads by either evaporation, sputtering, or electroplating to increase the connectivity between the bumps and the bump pads. Furthermore in the process of forming UBM layer, a part of the conductive material is still left over inside the gaps of the burnt fuse pads which cause electrical conductivity of originally burnt fuse pads. As a result, the original chip after recovery process loses its effect.

SUMMARY OF INVENTION

The present invention provides a method for preventing the burnt fuse pads from further electrical connection, which is suitable in the process of bumps on the bumps pads of a wafer. An insulating material is deposited into the gap caused by the burnt fuse pads. This results in that the burnt fuse pads on the two sides of the gap are electrically insulated to retain the effect of the original chip recovery process and to allow bumps to be formed on the bump pads of the wafer.

To fulfill the aforementioned object, the present invention provides a method for preventing burnt fuse pads from further electrical connection, which is suitable for the bump fabrication process for forming at least a bump on a wafer. A wafer with an active surface, a passivation layer, at least a bump pad and at least a fuse pad are provided. The bump pads and the fuse pads are located on the active surface of the wafer and the passivation layer exposes the bump pads and the fuse pads, wherein the central region of the fuse pads is burnt creating a gap. The present invention provides a method for preventing burnt fuse pads from further electrical connection which forms a dielectric layer on the active surface of the wafer that covers the bump pads and the fuse pads. A part of the material from the dielectric layer fills up the gaps in the fuse pads, and following the dielectric layer is patterned but retaining the dielectric layer that is covering the fuse pads and removing part of the dielectric layer that is covering the bump pads for exposing the bump pads. Therefore afterwards when forming the UBM layer on the bump pads of the wafer, the material from the UBM layer will not bridge the burnt fuse pads on two sides of the gap or will not fill up the gap which retains an electrical insulation status.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

First Embodiment

The present invention provides a method for preventing burnt fuse pads from further electrical connection, please refer to FIGS. 1A to 1E, wherein the flow diagram of the bump fabrication process according to the first embodiment of the present invention is shown.

Figure 1A:
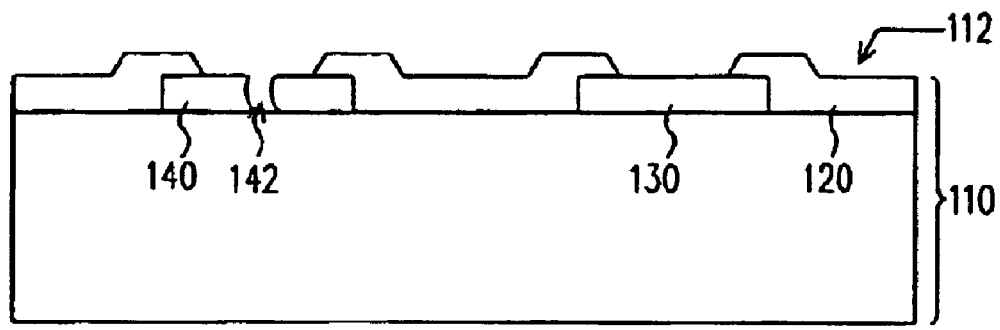
FIGS. 1A to 1E are schematic sectional diagrams of the flow diagram showing the bump fabrication process according to the first embodiment of the present invention.

As illustrated in FIG. 1A, a passivation layer 120, a plurality of bump pads 130 (only one is shown in the diagram), and a plurality of fuse pads 140 (only one is shown in the diagram) are located on an active surface 112 of a wafer 110, where the passivation layer 120 exposes the bump pads 130 and the fuse pads 140 on the active surface 112 of the wafer 110. It is to be noted that after the singulation of the wafer 110, the resulting semiconductor memory chips or other chips possess the fuse pad design which provides electrical insulation to the fuse pads 140 on the two sides of the gap 142 formed by laser burning during the patterning of the central region of the fuse pads 140.

Figure 1B:
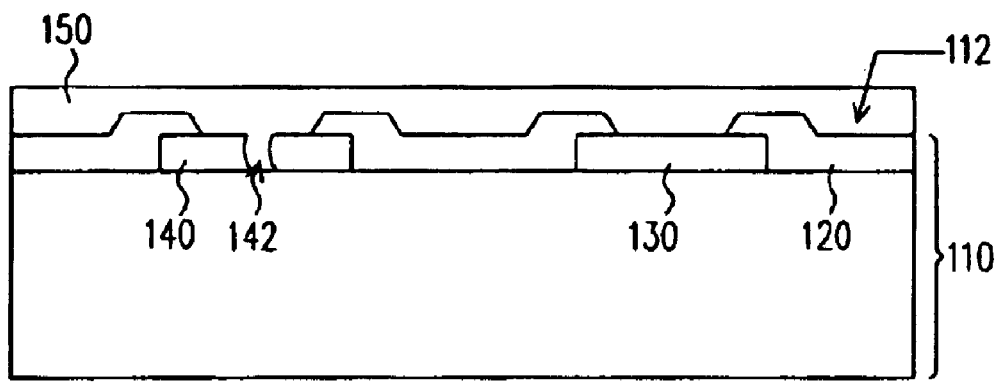

As illustrated in FIG. 1B, following a dielectric layer 150 is completely formed on the active surface 112 of the wafer 110 covering the passivation layer 120, the bump pads 130, and the fuse pads 140, wherein the dielectric layer 150 fills up the gap 142 of the fuse pads 140 for providing electrical insulation to the two sides of the fuse pads 140. The method of forming the dielectric layer 150 on the active surface 112 of the wafer 110 comprises spin coating and the material of the dielectric layer 150 comprises Benzocyclobutene (BCB), Poly-Imide (PI), Nitride, $SiN_3$, Spin-On Glass (SOG), Spin-On Dielectric (SOD), $SiO_x$, $SiO_2$, or the like insulating material.

Figure 1C:
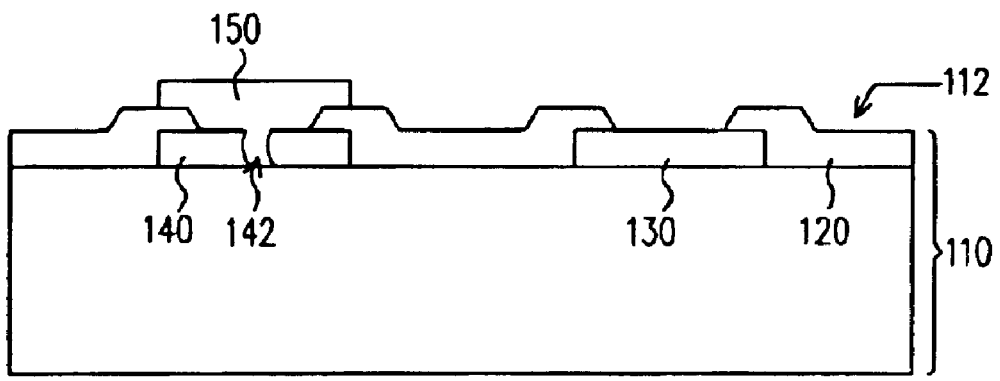

As illustrated in FIG. 1C, the dielectric layer 150 is patterned so as to remove the part of the dielectric layer 150 that is not above the fuse pads 140 and to remain the part of the dielectric layer 150 that is covering the fuse pads 140. Therefore the patterned dielectric layer 150, besides filling up the gap 142 of the fuse pads 140, also covers the fuse pads 140. The method of removing the dielectric layer comprises wet etching or dry etching, and dry etching can be for example plasma etching.

Figure 1D:
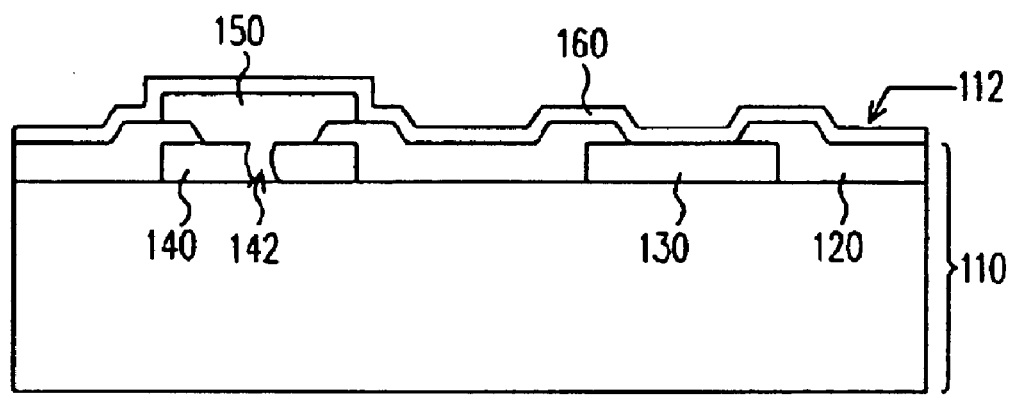
Figure 1E:
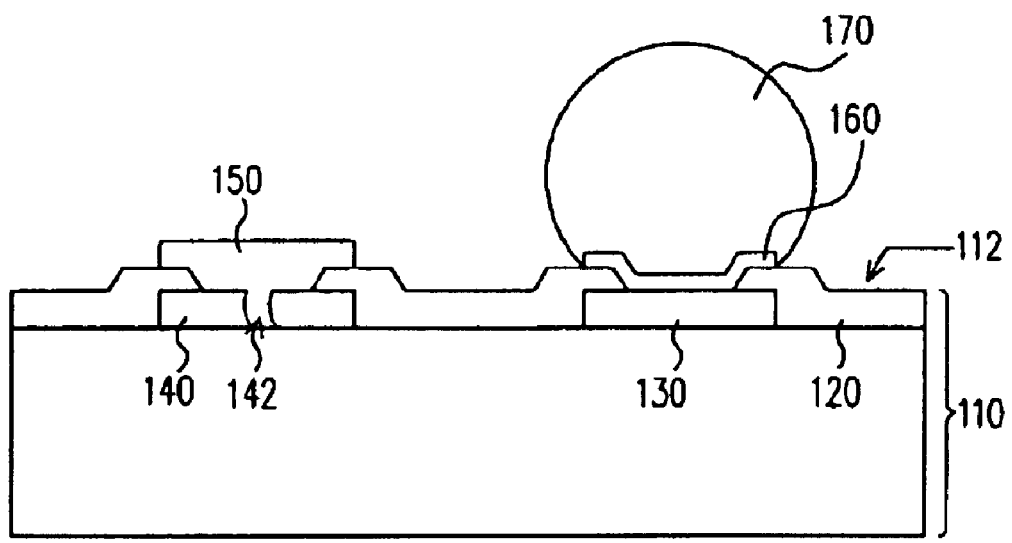

As illustrated in FIG. 1D, the UBM layer 160 are formed on the active surface 112 of the wafer 110 by evaporation, sputtering, electroplating, and the like. Due to the dielectric layer 150 covering the fuse pads 140, the material leftover from the UBM layer 160 is prevented from leaking into the gap 142 of the fuse pads 140 and therefore the two sides of the fuse pads 140 remain electrically insulated. Finally as illustrated in FIG. 1E, the UBM layer 160 are patterned so that the UBM layer 160 only cover bump pads 130 and thereafter the bumps 170 are formed on the UBM layer 160.

Figure 2A:
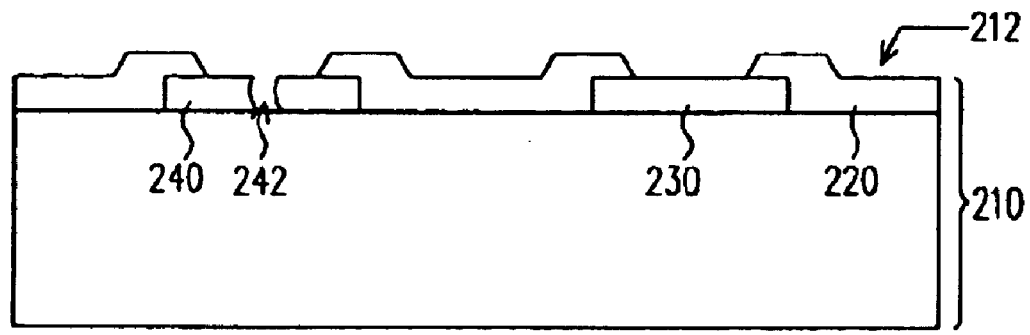
FIGS. 2A to 2E are schematic sectional diagrams of the flow diagram showing the bump fabrication process according to the second embodiment of the present invention.
Figure 2B:
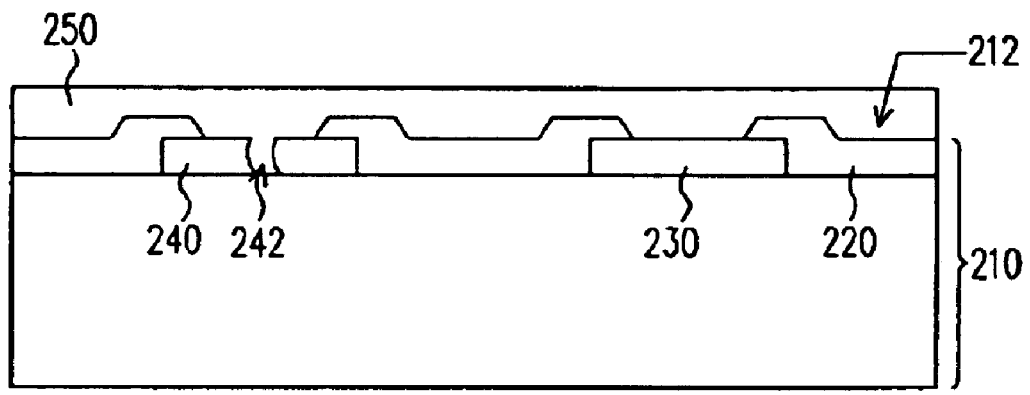
Figure 2C:
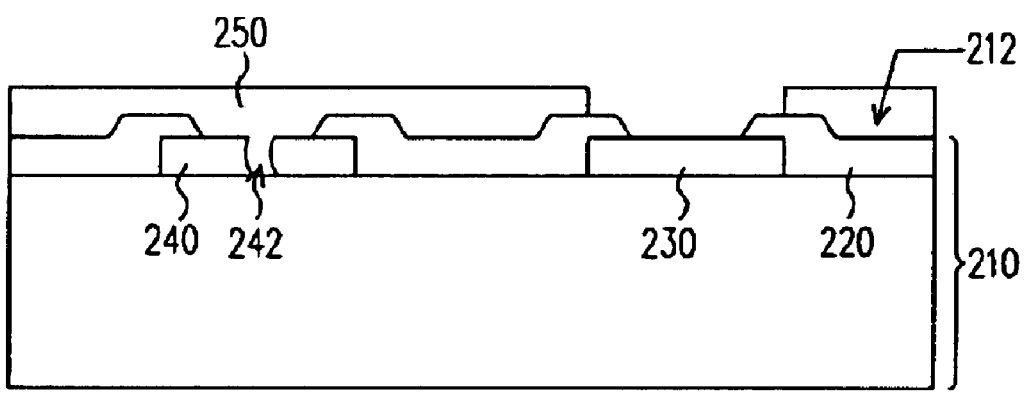

As illustrated in FIG. 2C, the dielectric layer 250 is patterned to remove the part of the dielectric layer 250 above the bump pads 230 for exposing the bump pads 230 and to remain the rest of the dielectric layer 250 on the active surface 212 of the wafer 210. Therefore the patterned dielectric layer 250, besides filling up the gap 242 of the fuse pads 240, also covers the fuse pads 240. Wherein the method of removing the dielectric layer comprises wet etching or dry etching, and dry etching can be for example plasma etching.

Second Embodiment

The second embodiment differs from the first embodiment for the distribution in the region of the dielectric layer on the active surface of the wafer. In order to illustrate the method for preventing burnt fuse pads from further electrical connection of the present invention, please referring to FIGS. 2A to 2E, which are schematic sectional diagrams of the flow diagram showing the bumps fabrication process according to the second embodiment of the present invention.

As illustrated in FIG. 2A, a passivation layer 220, a plurality of bump pads 230 (only one is shown in the diagram) and a plurality of fuse pads 240 (only one is shown in the diagram) are located on an active surface 212 of a wafer 210. Wherein, the passivation layer 220 exposes the bump pads 230 and the fuse pads 240 on the active surface 212 of the wafer 210. It is to be noted that the wafer 210, after cutting, forms the semiconductor memory chips or other chips, including the fuse pad design. The central region of the fuse pad 240s, as shown in FIG. 2A, is burnt by laser, and a gap 242 is thereby formed therein, so as to electrically isolate the two sides of the fuse pads 240.

As illustrated in FIG. 2B, following a dielectric layer 250 is completely formed on the active surface 212 of the wafer 210 covering the passivation layer 220, the bump pads 230, and the fuse pads 240, wherein the dielectric layer 250 fills up the gap 242 of fuse pads 240 for providing electrical insulation to the two sides of the fuse pads 240. The method of forming the dielectric layer 250 on the active surface 212 of the wafer 210 comprises spin coating and the material of the dielectric layer comprises benzocyclobutene (BCB) or the like material.

As illustrated in FIG. 1C, the dielectric layer 250 is patterned to remove the part of the dielectric layer 250 above the bump pads 230 for exposing the bump pads 230 and to remain the rest of the dielectric layer 250 on the active surface 212 of the wafer 210. Therefore the patterned dielectric layer 250, besides filling up the gap 242 of the fuse pads 240, also covers the fuse pads 240. Wherein the method of removing the dielectric layer comprises wet etching or dry etching, and dry etching can be for example plasma etching.

Figure 2D:
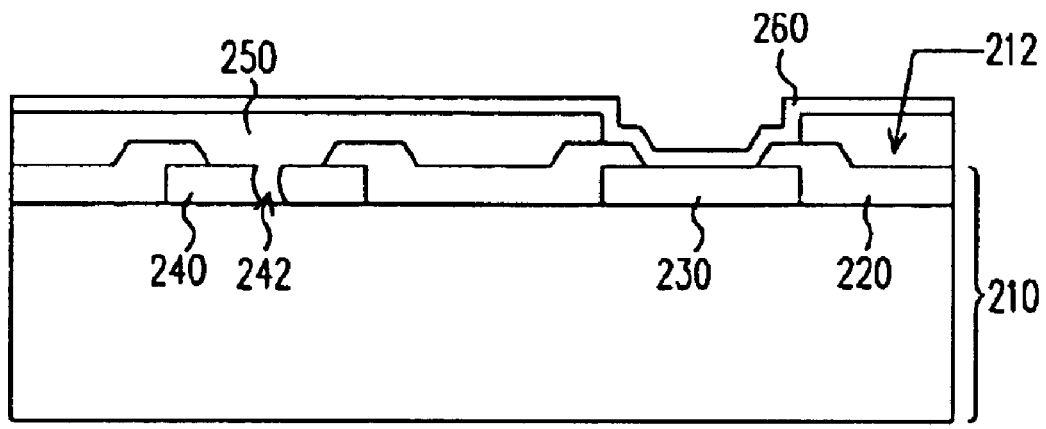
Figure 2E:
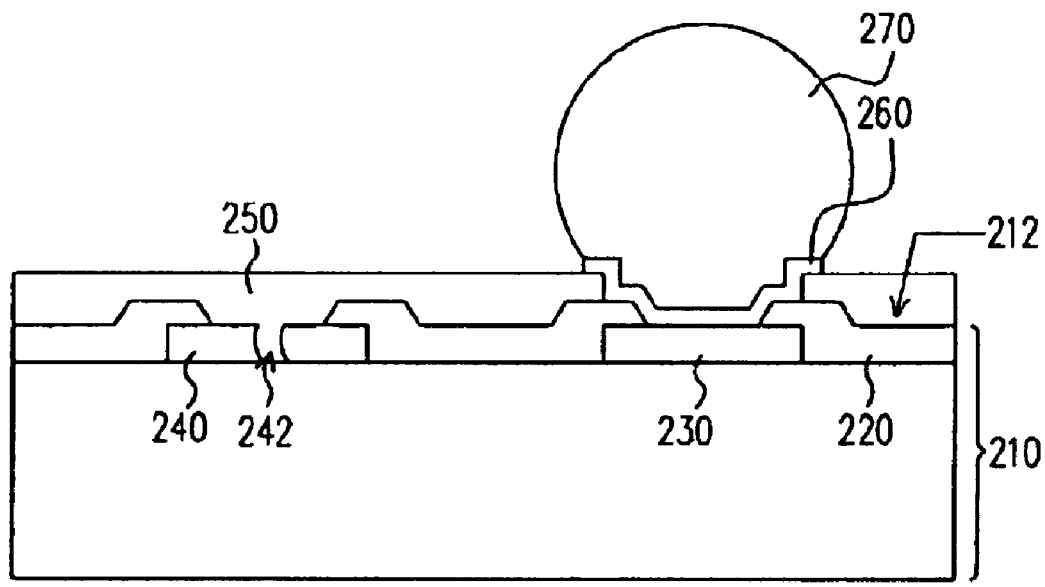

As illustrated in FIG. 2D, the UBM layer 260 are formed on the active surface 212 of the wafer 210 by evaporation, sputtering, electroplating, and the like. Due to the dielectric layer 250 covering the fuse pads 240, the material from the UBM layer 260 is prevented from leaking into the gap 242 of the fuse pads 240 and therefore the two sides of the fuse pads 240 remain electrically insulated. Finally as illustrated in FIG. 2E, the UBM layer 260 are patterned so the UBM layer 260 only cover bump pads 230 and the bumps 270 are formed on the UBM layer 260.

It is to be noted if the packaged chip is coupled to a carrier, the coefficient of thermal expansion (CTE) of the chip and the carrier are different. Therefore the material of the dielectric layer is not restricted to be a solely insulating material but can also be an elastic insulating material such as Benzocyclobutene (BCB) or other insulating material having elastic properties to buffer the thermal stress. The thermal stress usually is caused by the different CTE of the chip and the carrier.

The second embodiment of the present invention first covers the dielectric layer over the fuse pads before the formation of the bumps on the wafer, especially covering the burnt fuse pads. This effectively prevents subsequent fabrication process such as the fabrication process of UBM layer from leaking unnecessary residual conductive material onto the central region or inside the gap of the fuse pads to ensure the two sides of the burnt fuse pads are electrically insulted. Furthermore after the removal of the dielectric layer covering the bump pads, a large portion of leftover dielectric layer having elastic properties buffers the thermal stress caused by different CTEs of the chip and the carrier.

Summarizing the above, the present invention provides a method for preventing burnt fuse pads from further electrical connection by first covering the burnt fuse pads with a dielectric layer before the formation of the bumps on the bump pads of the wafer. The residual conductive material from the formation of the UBM layer is prevented from leaking into the gap of the burnt fuse pads which renders the chip recovery process by using fuse pads ineffective. Furthermore if the dielectric layer possess elastic properties, due to the large portion of the dielectric layer remaining after the remove of some over the bump pads, the dielectric layer buffers the thermal stress caused by the different coefficient of thermal expansions of the chip and the carrier.

It will be apparent to those skilled in the art that various modifications and variations can be made to the structure and method of the present invention without departing from the scope or spirit of the present invention. In view of the foregoing description, it is intended that the present invention covers modifications and variations of this invention provided they fall within the scope of the following claims and their equivalents.

What is claimed is:

1. A method for preventing a burnt fuse pad from further electrical connection suitable in a bump fabrication process for forming a bump on a wafer, wherein the wafer comprises an active surface, a passivation layer, at least a bump pad and the burnt fuse pad, wherein the bump pad and the burnt fuse pad are located on the active surface of the wafer, the passivation layer exposes the bump pad and the burnt fuse pad, wherein a gap is formed at a central region of the burnt fuse pad, the method comprising:

forming a dielectric layer over the active surface of the wafer, wherein the burnt fuse pad is covered by a part of the dielectric layer; and patterning the dielectric layer to remove all the dielectric layer that is not covering above the burnt fuse pad, wherein the remaining dielectric layer is formed only directly above the burnt fuse pad and in the gap.

2. The method of claim 1, wherein the step of forming the dielectric layer over the active surface of the wafer comprises spin coating.

3. The method of claim 1, wherein the dielectric layer comprises an insulating elastic material.

4. The method of claim 1, wherein the dielectric layer includes one selected from the group consisting of Benzo-cyclobutene (BCB), Poly-Imide (PI), Nitride, $SiN_3$, Spin-On Glass (SOG), Spin-On Dielectric (SOD), $SiO_x$, and $SiO_2$.

5. The method of claim 1, wherein the step for removing the dielectric layer comprising wet etching.

6. The method of claim 1, wherein the step for removing the dielectric layer comprising dry etching.

7. The method of claim 6, wherein the step for removing the dielectric layer further comprising plasma etching.

8. A method for preventing a burnt fuse pad from further electrical connection suitable in a bump fabrication process for forming a bump on a wafer, wherein the wafer comprises an active surface, a passivation layer, a bump pad and at least one fuse pad, wherein the bump pad and the at least one fuse pad are located on the active surface of the wafer, the passivation layer exposes the bump pad and the at least one fuse pad, wherein the at least one fuse pad includes a fuse pad that has been separated into two portions by a gap, the method comprising:

forming a dielectric layer over the at least one fuse pad, wherein the gap is also filled; and removing a portion of the dielectric layer, wherein a remaining portion of the dielectric layer is formed only directly above the burnt fuse pad and in the gap.

* * * * *